United States Patent
Breems (10) Patent No.: US 10,333,545 B2
(45) Date of Patent: Jun. 25, 2019

(54) SIGMA-DELTA MODULATOR

(71) Applicant: NXP B.V., Eindhoven (NL)

(72) Inventor: Lucien Johannes Breems, Eindhoven (NL)

(73) Assignee: NXP B.V., Eindhoven (NL)

( * ) Notice: Subject to any disclaimer, the term of this patent is extended or adjusted under 35 U.S.C. 154(b) by 405 days.

(21) Appl. No.: 14/558,217

(22) Filed: Dec. 2, 2014

(65) Prior Publication Data

US 2015/0171888 A1 Jun. 18, 2015

(30) Foreign Application Priority Data

Dec. 6, 2013 (EP) .................................... 13196062

(51) Int. Cl.
*H03M 3/00* (2006.01)

(52) U.S. Cl.
CPC ............. *H03M 3/45* (2013.01); *H03M 3/368* (2013.01); *H03M 3/452* (2013.01)

(58) Field of Classification Search
CPC ................................ H03M 3/30; H03M 3/456
USPC ......................................................... 341/143
See application file for complete search history.

(56) References Cited

U.S. PATENT DOCUMENTS

| | | | | |
|---|---|---|---|---|
| 5,585,801 | A | * | 12/1996 | Thurston ............... H03M 3/366 341/143 |
| 6,721,427 | B1 | * | 4/2004 | Yamada .................. H03H 7/07 341/110 |
| 6,975,257 | B2 | | 12/2005 | Reefman et al. |
| 7,098,730 | B1 | * | 8/2006 | Shui .................... H03H 11/1291 327/552 |
| 7,253,758 | B2 | | 8/2007 | Chang et al. |
| 7,554,474 | B2 | | 6/2009 | Le Guillou |
| 7,583,215 | B2 | * | 9/2009 | Yamamoto ............ H03M 3/406 341/143 |
| 7,714,681 | B2 | | 5/2010 | Berg |
| 7,755,525 | B2 | * | 7/2010 | Nanda .................... H02M 3/157 341/143 |
| 7,928,878 | B1 | | 4/2011 | Coban et al. |
| 8,836,551 | B2 | | 9/2014 | Nozaki |
| 8,891,708 | B2 | | 11/2014 | McGrath |
| 9,178,530 | B2 | * | 11/2015 | Mitani .................... H03M 3/44 |
| 2008/0169953 | A1 | | 7/2008 | Yamamoto et al. |
| 2008/0297387 | A1 | * | 12/2008 | Doerrer .............. H03H 11/1252 341/143 |
| 2009/0191837 | A1 | | 7/2009 | Nanda et al. |

(Continued)

FOREIGN PATENT DOCUMENTS

| | | |
|---|---|---|
| CN | 1586040 A | 2/2005 |
| CN | 101194420 A | 6/2008 |

(Continued)

OTHER PUBLICATIONS

De Maeyer, et al., Controlled behavior of STF in CT Sigma[Delta] modulators, Electronics Letter, IEE Stevenage, GB, vol. 41, No. 16, Aug. 4, 2005, pp. 896-897.

(Continued)

*Primary Examiner* — Linh V Nguyen (57) ABSTRACT

Proposed is a sigma-delta modulator circuit. The circuit comprises a loopfilter having at least one integrator or resonator section; and a feed-forward path adapted to provide a feed-forward signal to the output of the at least one integrator or resonator section via a filter.

16 Claims, 8 Drawing Sheets

(56) References Cited

U.S. PATENT DOCUMENTS

| | | | |
|---|---|---|---|
| 2010/0040175 A1* | 2/2010 | Muraguchi | H04L 27/3818 375/326 |
| 2011/0075775 A1* | 3/2011 | Coban | H03M 3/344 375/350 |
| 2012/0188107 A1 | 7/2012 | Ashburn, Jr. et al. | |
| 2013/0021183 A1* | 1/2013 | Ashburn, Jr. | H03M 3/368 341/143 |
| 2013/0021184 A1* | 1/2013 | Ashburn, Jr. | H03M 3/374 341/143 |
| 2013/0117790 A1* | 5/2013 | Coban | H03M 3/00 725/71 |
| 2013/0187803 A1* | 7/2013 | Kaald | H03M 3/37 341/143 |
| 2014/0159930 A1* | 6/2014 | Ho | H03M 3/32 341/143 |

FOREIGN PATENT DOCUMENTS

| | | |
|---|---|---|
| CN | 102349235 A | 2/2012 |
| CN | 103312328 A | 9/2013 |
| JP | 2010171484 A | 8/2010 |
| JP | 2013/102638 | 5/2013 |
| WO | 2012/100105 A1 | 7/2015 |

OTHER PUBLICATIONS

Shin, et al., A 6.25 MHz BW 8-OSR fifth-order single-stage sigma-delta ADC Circuits and Systems (ISCAS), 2011 IEEE Int'l. Symposium, May 15, 2011, pp. 1117-1120.

Silva, et al., Wideband low-distortion delta-sigma ADC topology, Electronics Letter, IEE Stevenage, GB, vol. 37, No. 12, Jun. 7, 2001, pp. 737-738.

EP Communication for EP Appl. No. 13196062.7 dated Apr. 16, 2014 and EESR dated Apr. 10, 2014.

Office Action Appln. No. CN 201410662650.2; 9 pages (dated May 31, 2017).

* cited by examiner

SIGMA-DELTA MODULATOR

CROSS-REFERENCE TO RELATED APPLICATIONS

This application claims the priority under 35 U.S.C. § 119 of European patent application no. 13196062.7, filed on Dec. 6, 2013, the contents of which are incorporated by reference herein.

FIELD OF THE INVENTION

This invention relates to the field of signal processing, and more particular to sigma-delta modulators for providing digital signals.

BACKGROUND

Sigma-delta ($\Sigma\Delta$) (or delta-sigma ($\Delta\Sigma$)) modulation is a known method for encoding analogue signals into digital signals or higher-resolution digital signals into lower-resolution digital signals. The conversion is done using negative feedback, where the difference between the two signals is measured and used to improve the conversion. This conversion technique may be used in electronic components such as Analog-to-digital converters (ADCs), digital-to-analog converters (DACs), frequency synthesizers, switched-mode power supplies and motor controllers.

A sigma-delta modulator is a feedback system consisting of a loop filter (with transfer function generally denoted as H(s)), an ADC (or quantizer), and a DAC in the feedback path. Such a basic conventional configuration is shown in FIG. 1.

A sigma-delta modulator is oversampled. In combination with the feedback path and the loopfilter, the quantization error is approximately shaped according to the inverse of the loopfilter characteristic in the frequency region where the loopfilter gain is high. The quantization error of the quantizer ADC is in this way suppressed in a signal band of interest.

For frequencies where the loopfilter gain decreases, the quantization noise increases. However, by means of a digital decimation filter at the output of the sigma-delta modulator, the out-of-band increasing quantization noise is filtered away and very high resolutions can be achieved in relatively small bandwidths.

Figure 1:
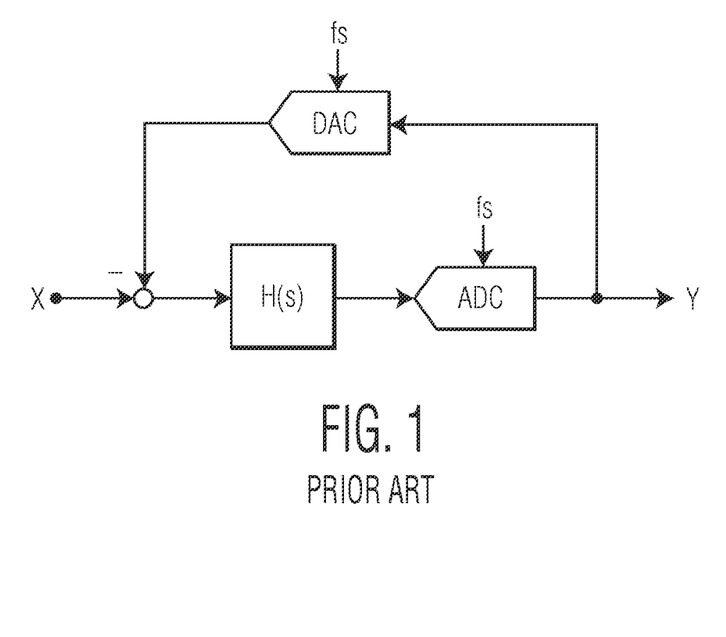
FIG. 1 shows a basic configuration of a conventional delta-sigma modulator.

The loopfilter H(s) of the sigma-delta modulator of FIG. 1 can be implemented in several ways, and the so-called distributed feed-forward topology and the feedback topology are the most common implementations.

Figure 2:
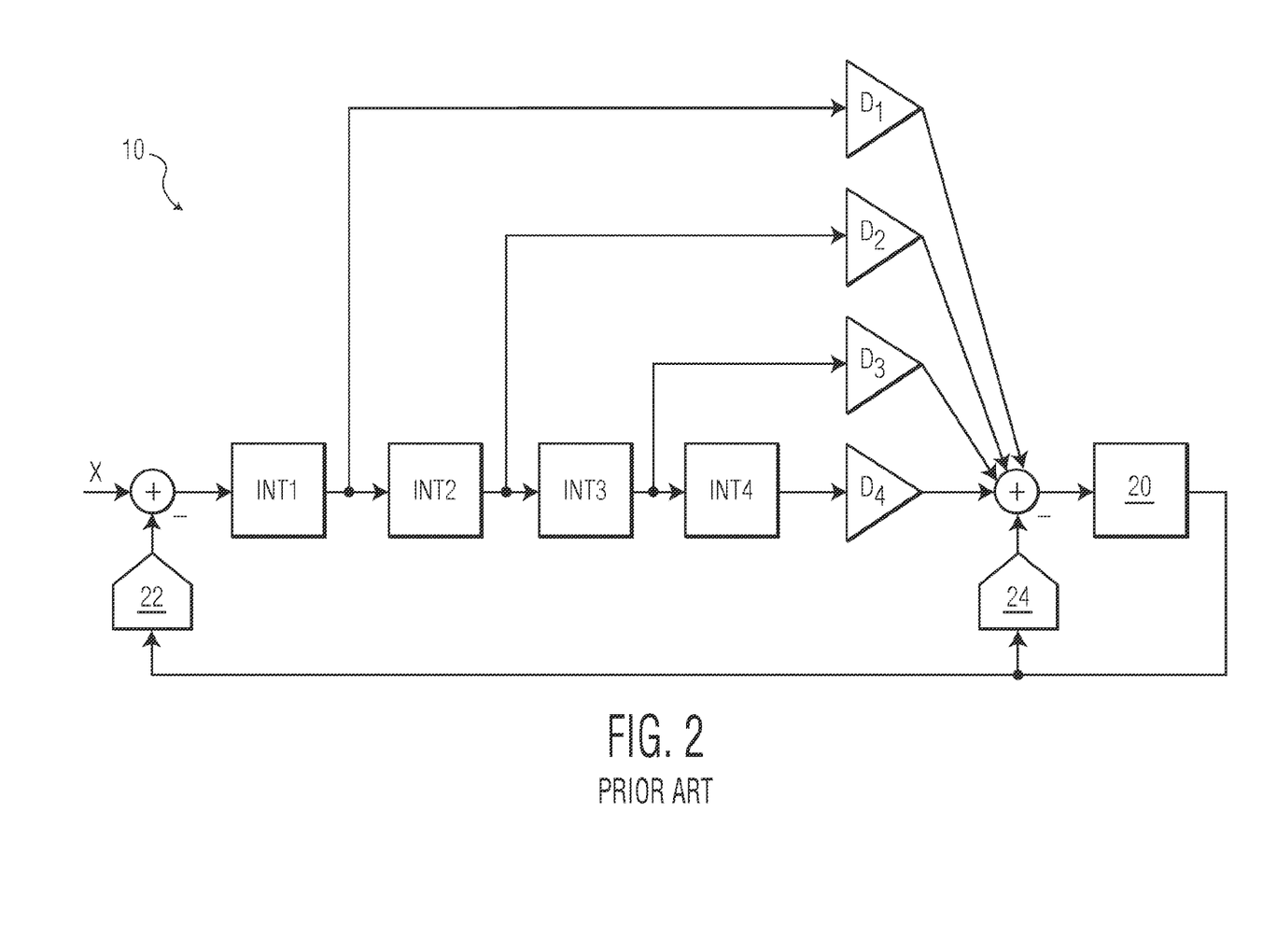
FIG. 2 is a schematic block diagram of a conventional $4^{th}$-order sigma-delta modulator having distributed feed-forward paths.

FIG. 2 shows a typical $4^{th}$-order architecture with distributed feed-forward paths. The circuit 10 comprises four integrator stages Int1 to Int4. There is a feed forward from the output of each integrator to the output of the loop filter. The loop filter output is fed to an ADC 20. The circuit has a negative feedback path to the input of the first integrator stage. The digital output from ADC 20 is converted to an analogue signal by a first DAC 22, which provides the analogue signal to the input of the first integrator Int1. Typically, another feedback path with a second DAC 24 provides an analogue signal to the output of the loop filter. This optional second feedback path compensates for excess delays in the ADC 20 and feedback DAC 22.

Figure 3:
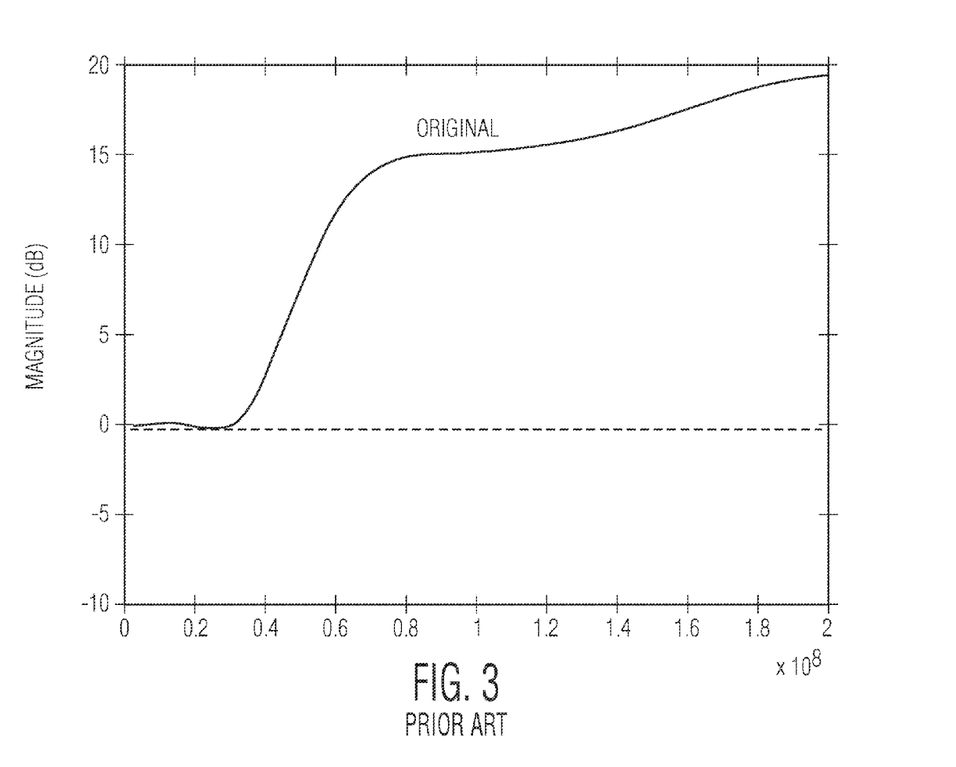
FIG. 3 is shows a possible signal transfer function for the 4th-order sigma-delta modulator of FIG. 2.

FIG. 3 shows an example of a possible signal transfer function (STF) for the $4^{th}$-order sigma-delta modulator of FIG. 2. It is seen that the STF is flat for a small frequency band and then increases for higher frequencies. The out-of-band STF gain can reach 20 dB or higher values, depending on the coefficients of the loop filter. This is inherent to the feed-forward architecture.

Thus, it will be appreciated that a distributed feed-forward architecture, such as that shown in FIG. 2, exhibits the drawback that the STF of the modulator exhibits out-of-band peaking very close to the signal bandwidth.

BRIEF SUMMARY OF THE INVENTION

According to an aspect of the invention, there is provided a sigma-delta modulator circuit comprising: a loopfilter having at least one integrator or resonator section; and a feed-forward path adapted to provide a feed-forward signal to the output of the at least one integrator or resonator section via a filter, the feed-forward signal being taken from a circuit node before the at least one integrator or resonator section.

It is proposed to include a filter in a signal feed-forward path of a sigma-delta modulator. The inclusion of a filter in a feed-forward path of a sigma-delta modulator may reduce peaking behaviour of the STF. Reduction of peaking of the STF of a sigma-delta modulator may relax the requirements placed on a pre-filter for the sigma-delta modulator.

The feed-forward signal may be taken from any node of the sigma-delta modulator circuit prior to (i.e. before) an integrator or resonator section of the loopfilter. Thus, the feed-forward signal may be taken the input of the sigma-delta modulator circuit. Alternatively, the feed-forward signal may be taken from the input of the loopfilter, or may even be taken from a node inside the loopfilter (and positioned before the integrator or resonator section).

Embodiments may provide a way to move out-of-band signal peaking of a distributed feed-forward architecture to higher frequencies, thereby relaxing the requirements of a pre-filter. Some embodiments may even eliminate the need to implement a pre-filter.

Embodiments may therefore be employed in many different types of sigma-delta modulators that employ a feed-forward architecture. Such sigma-delta modulators may include discrete time sigma-delta modulators, band-pass sigma-delta modulators, low-frequency sigma-delta modulators, high-frequency sigma-delta modulators, continuous time sigma-delta modulators, low-order sigma-delta modulators, high-order sigma-delta modulators, complex sigma-delta modulators, cascaded (MASH) sigma-delta modulators, etc.

The filter may implement poles and zeros or a phase shift in the feed-forward path. For example, the phase shift introduced by the filter may be 30°, 90°, 120°, 150°, 180°, etc.

The sigma-delta modulator circuit may be a discrete-time sigma-delta modulator circuit, and the filter may be adapted to implement a time delay. Such a time delay may be selected so as to cater for particular signal frequencies of interest.

Embodiments may employ a filter in one or more of the plurality of feedforward paths. For example, one embodiment may employ a filter in each feedforward path provided in a sigma-delta modulator circuit. Another embodiment may employ a filter in only one of a plurality of feedforward paths provided in a sigma-delta modulator circuit.

Embodiments may be employed in an ADC, a DAC, a frequency synthesizer, a switched-mode power supply, a motor controller, or any combination thereof.

BRIEF DESCRIPTION OF THE DRAWINGS

Preferred embodiments of the present invention will now be described, by way of example only, with reference to the following drawings in which.

DETAILED DESCRIPTION OF THE EMBODIMENTS

It is proposed to tune the peaking behaviour of the STF by adding a filter in the signal feed-forward path of a sigma-delta modulator.

Figure 4:
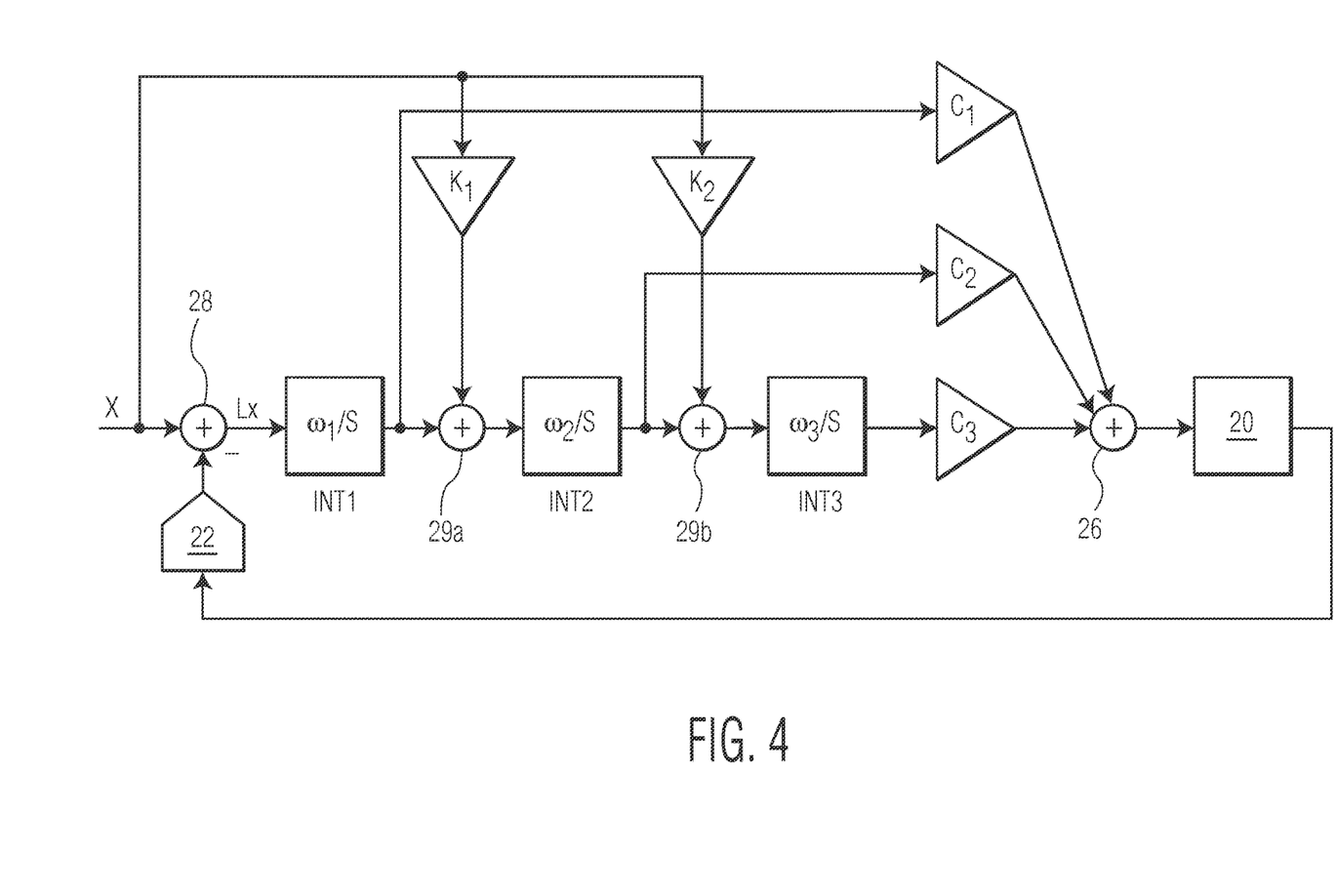
FIG. 4 is a schematic block diagram of a 3rd-order feed-forward sigma-delta modulator according to an embodiment of the invention.

Referring to FIG. 4, there is shown a $3^{rd}$ order feed-forward sigma-delta modulator according to an embodiment. The modulator comprises a series connection of three integrators Int1 to Int3. Feed-forward paths $c_1$-$c_3$ are provided from the output of each integrator to an output summation node 26 at the output of the loop filter. The output of the output summation node 26 is provided to a quantizer ADC 20.

The digital output from the ADC 20 is converted to an analog feedback signal by a DAC 22, which is then subtracted from the input signal x at an input summation node 28 (which subtracts the analog feedback signal provided by the DAC 22 from the input signal x) to provide the loopfilter input signal Lx (i.e. the input of the first integrator Int1).

It is further assumed that, in this example, the integrator stages Int1-Int3 are implemented as continuous-time integrators with a transfer function $\omega_i/s$, wherein $\omega_i$ is the unity gain frequency of the $i^{th}$ integrator stage. For simplicity, it will be assumed that the unity gain frequency for each stage is equal to 1. In that case, the transfer function of the feed-forward path of the modulator of FIG. 4 can be as the following equation (Equation 1):

$$H_{FW} = \frac{c_1 s^2 + c_2 s + c_3}{s^3} \quad \text{(Equation 1)}$$

The STF peaking issue of the sigma-delta modulator can be resolved by eliminating the s terms in the numerator polynomial.

An implementation to cancel the s-terms from the numerator has been applied to a conventional sigma-delta circuit to arrive at the circuit shown in FIG. 4, wherein additional signal feed-forward paths have been added.

A first feed-forward path comprises a first filter k1 connected between the input signal x and the output of the first integrator Int1. A second feed-forward path comprises a second filter k2 connected between the input signal x and the output of the second integrator Int2. Thus, the output of the first filter k1 is combined with output of the first integrator Int1 at second summation node 29a, and the output of the second filter k2 is combined with output of the second integrator Int2 at third summation node 29b.

Each feed-forward path is adapted to provide a feed-forward signal to the output of a respective integrator section via a respective filter. The feed-forward signal of each feed-forward path is taken from the input signal x of the sigma-delta modulator (from which the inputs of the first Int1 and second int2 integrators are derived).

This modifies the feed-forward filter transfer function into the following equation (Equation 2):

$$H_{FW} = \frac{(c_2 \cdot k_1 + c_3 \cdot k_2 + c_1)s^2 + (c_3 \cdot k_1 + c_2)s + c_3}{s^3} \quad \text{(Equation 2)}$$

If the first k1 and second filters k2 are chosen to be as follows:

$$k_1 = -\frac{c_2}{c_3} \quad \text{(Equation 3)}$$

$$k_2 = -\frac{c_1}{c_3} + \left(\frac{c_2}{c_3}\right)^2,$$

the forward transfer function is modified to the following equation (Equation 4):

$$H_{FW} = \frac{c_3}{s^3}, \quad \text{(Equation 4)}$$

which does not give rise to STF peaking.

It is noted here that different values for feed-forward paths k1 and or k2 may also result in elimination or reduction of the STF peaking.

In certain situations, it may be that (due to the implementation of the loop filter, for example), certain nodes in the loopfilter are not physically accessible. This can be the case, for example, if a single-opamp biquad filter architecture is used to implement (part of) the loopfilter.

Figure 5:
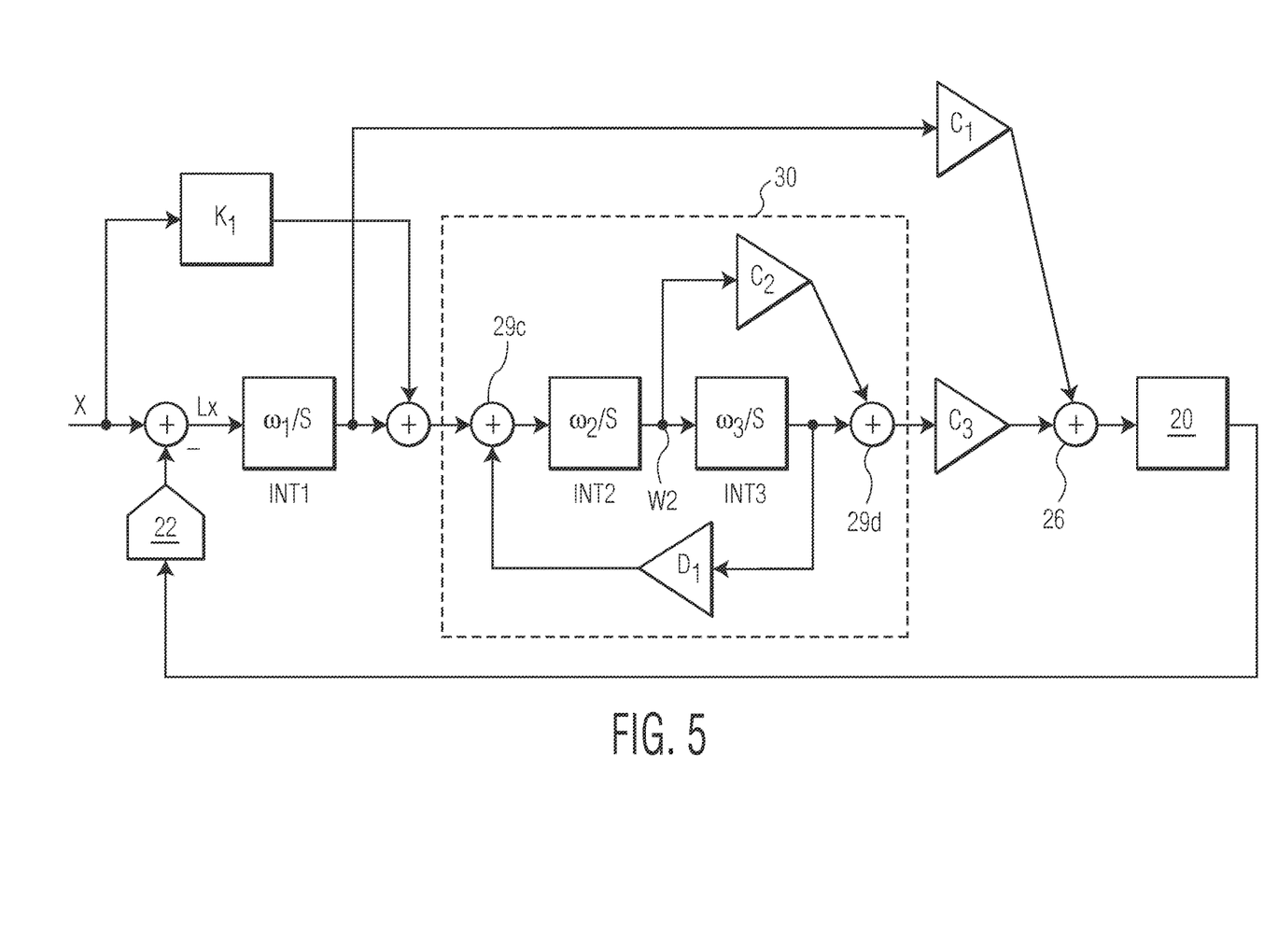
FIG. 5 is a schematic block diagram of a $3^{rd}$-order continuous-time sigma-delta modulator with a resonator implemented as a single-opamp biquad filter and a single signal feed-forward path.

An example is shown in FIG. 5, where the loopfilter consists of an integrator Int1 and a resonator 30. In this case, the resonator is implemented as a single opamp biquad filter (dashed box labelled "30").

Here, the single opamp biquad filter 30 comprises the second Int2 and third Int3 integrators connected in series, with the output of the third integrator Int3 being provided to a feedback summation node 29c via a feedback path d1. The feedback summation node 29c sums the input of the single opamp biquad filter 30 with then feedback signal from the integrator d1 and provides the summation as the input signal of the second integrator Int2. A feedforward path is provided from the output (i.e. internal node w2) of the second integrator Int2 to an output summation node 29d via a feedforward integrator c2. The output summation node 29d combines (i.e. sums) the output from the feedforward integrator c2 with the output of the third integrator Int3 to provide the output signal of the biquad filter 30.

As a result, the internal node w2 (although shown in FIG. 5) cannot be accessed and a second signal feed-forward path k2 as in FIG. 4 cannot be implemented. In this case the forward path transfer function may be represented by the following equation (Equation 5) (assuming d1=0 for simplicity):

$$H_{FW} = \frac{(c_2 \cdot c_3 \cdot k_1 + c_1)s^2 + (c_3 \cdot k_1 + c_2 \cdot c_3)s + c_3}{s^3} \quad \text{(Equation 5)}$$

Now, the forward transfer function can be simplified into the one of Eq. 4 in case k1 is a filter that is equal to Eq. 6:

$$k_1 = -\frac{c_1 s + c_2 \cdot c_3}{c_2 \cdot c_3 s + c_3}, \quad \text{(Equation 6)}$$

which has a pole and a zero.

Figure 6:
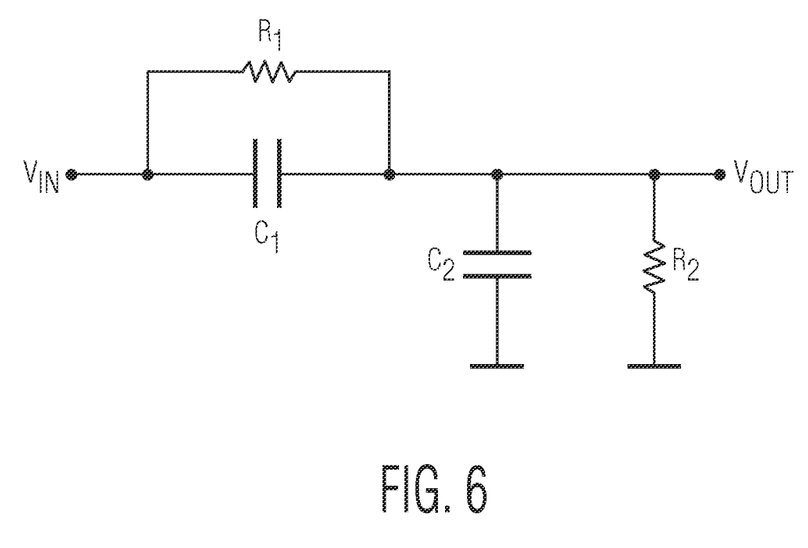
FIG. 6 shows a possible implementation for the signal feed-forward path of FIG. 5.

A possible implementation for the filter transfer of Equation 6 is shown in FIG. 6. The transfer function of this filter may be represented by the following equation (Equation 7):

$$H = -\frac{R_1 R_2 C_1 s + R_2}{R_1 R_2 (C_1 + C_2)s + R_1 + R_2} \quad \text{(Eq. 7)}$$

Other types of filter may also be implemented in the feed-forward path from the input of the modulator to the output of one of the integrator sections of the loop filter. Also, multiple filters may be implemented from the input of the modulator to the output of multiple integrator or resonator sections of the loop filter. Further, instead of the input signal x of the modulator, other signals may be fed-forward from different nodes of the loopfilter, for example the input signal Lx of the loopfilter.

Figure 7:
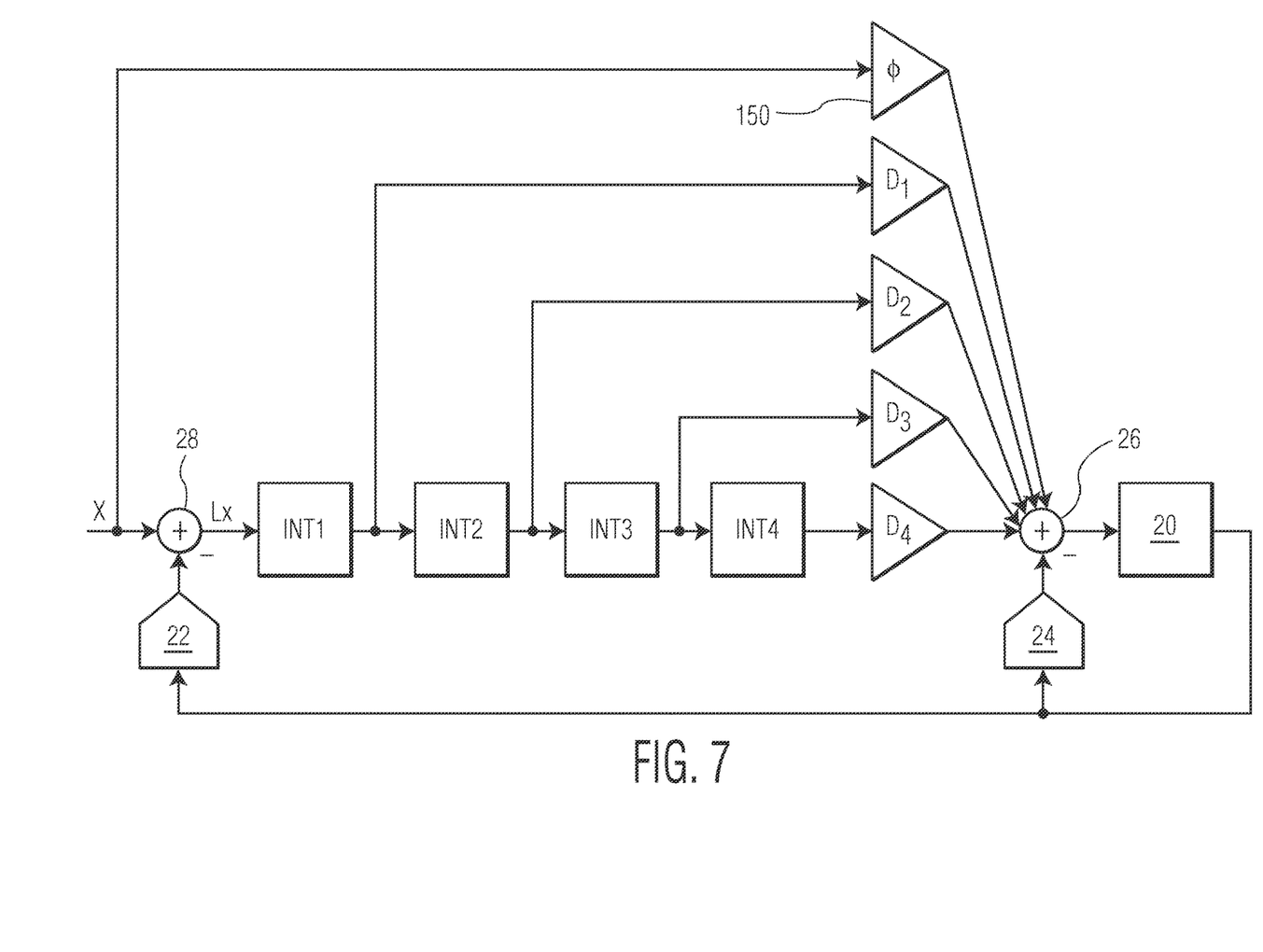
FIG. 7 is schematic block diagram of a 4th-order feed-forward sigma-delta modulator according to an embodiment of the invention.

Referring to FIG. 7, there is shown a $4^{th}$-order feed-forward sigma-delta modulator according to an embodiment. The sigma-delta modulator circuit 100 is similar to that of FIG. 2 in that it comprises a series connection of four integrators Int1 to Int4. A feed-forward path is provided from the output of each of the integrators Int1, Int2, Int3 Int4 to output summation node 26 (which provides the input of the ADC 20). The digital output from the ADC 20 is converted to an analogue signal by a first DAC 22 which provides the analogue signal to the input summation node 28 (which subtracts the analog feedback signal provided by the DAC 22 from the input signal x) to provide the input of the first integrator Int1. Thus, a feedback path is provided which combines an output signal of the sigma-delta modulator circuit with an input signal of the sigma-delta modulator circuit so as to provide the input signal of the first integrator Int1.

The digital output from the ADC 20 is also converted to an analogue signal at second DAC 24 which provides the analogue signal to the output summation node.

The sigma-delta modulator circuit 100 of FIG. 7 differs from the conventional circuit of FIG. 2 in that there is provided a feed-forward path from the input x of the modulator to the output summation node 26.

Here, it is noted that the feed-forward path takes the input signal x of the modulator and provides it to the output summation node 26.

The feed-forward path includes a filter 150. In this example, the filter 150 is a simple phase shift filter that introduces a phase shift Δφ into the feed-forward path. For example, the phase shift introduced by the filter 150 may be 30°, 90°, 120°, 150°, 180°, etc.

Figure 8:
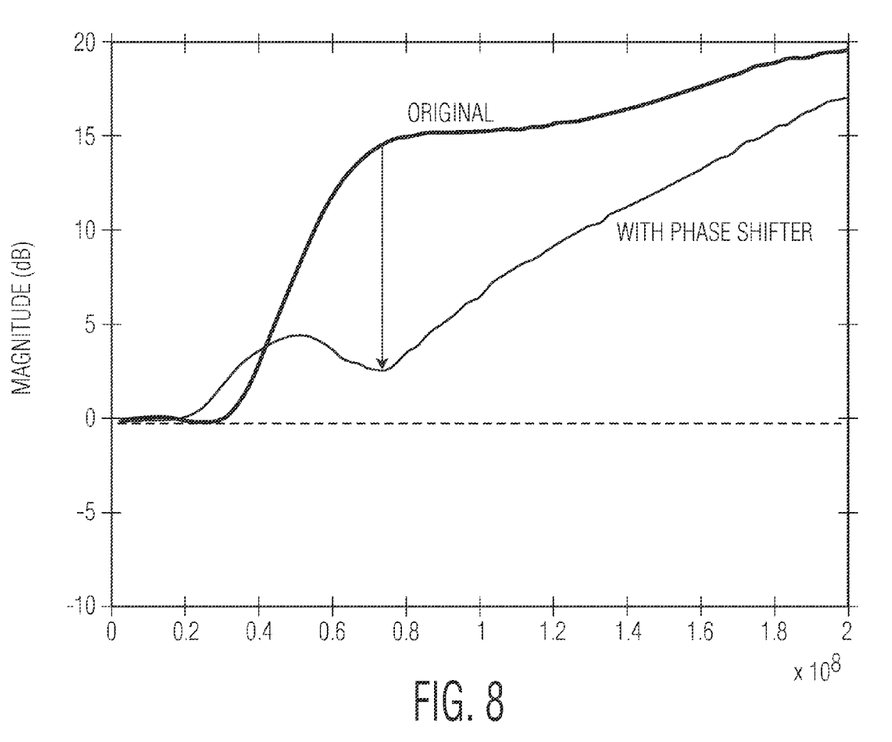
FIG. 8 is a graph illustrating the STF for the modified embodiment of FIG. 6.

FIG. 8 shows an example STF for the $4^{th}$-order sigma-delta modulator of FIG. 7. From the graph of FIG. 8, it can be seen that (compared to the STF of conventional circuit) the peaking observed in embodiment of FIG. 7 is reduced considerably at low frequencies. In other words, the embodiment of FIG. 7 mitigates STF peaking that is typically present in a feed forward sigma-delta topology.

Other types of filter may also be implemented in the feed-forward path from the input of the modulator to the output of one of the integrator sections of the loop filter. For example, the phase shift may be implemented using a weighted vector summation of quadrature signals.

Also, for a discrete-time sigma-delta modulator circuit, a filter in the feed-forward path may be implemented using a time delay. Depending on the time delay implemented, the circuit may be optimised for particular frequencies.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A sigma-delta modulator circuit comprising:
    a loopfilter having at least one integrator or resonator section, and an output summation node after the integrator or resonator section;
    a feed-forward path configured to provide a feed-forward signal to the output summation node via a filter configured to implement a specific phase shift and compensate peaking behavior in a signal transfer function of the sigma-delta modulator, the feed-forward signal being taken from a circuit node before the at least one integrator or resonator section; and
    an ADC; wherein the output summation node is directly coupled to the ADC.

2. The circuit of claim 1, wherein the feed-forward signal is the sigma-delta modulator circuit input signal.

3. The circuit of claim 1, further comprising:
    a feedback path configured to combine an output signal of the sigma-delta modulator circuit with an input signal of the sigma-delta modulator circuit so as to provide the loopfilter input signal, wherein the feed-forward signal is the loopfilter input signal.

4. The circuit of claim 1, wherein the circuit node is within the loopfilter.

5. The circuit of claim 1, wherein the sigma-delta modulator circuit is a discrete-time sigma-delta modulator circuit, and wherein the filter is configured to implement a time delay.

6. The circuit of claim 1, wherein the ADC is a quantizer configured to quantize an output signal from the loopfilter.

7. The circuit of claim 1, further comprising:
a second feed-forward path configured to provide a second feed-forward signal via a second filter, the second feed-forward path being different from the feed-forward path.

8. A circuit arrangement comprising:
the sigma-delta modulator circuit as claimed in claim 1.

9. A switched-mode power supply comprising the sigma-delta modulator circuit as claimed in claim 1.

10. A method of operating a sigma-delta modulator circuit comprising a loopfilter having at least one integrator or resonator section, and an output summation node after the integrator or resonator section, wherein the output summation node is directly coupled to an ADC, the method comprising:
providing a feed-forward signal to the output summation node via a filter configured to implement a specific phase shift and compensate peaking behavior in a signal transfer function of the sigma-delta modulator, wherein the feed-forward signal is taken from a circuit node before the at least one integrator or resonator section.

11. The method of claim 10, wherein the feed-forward signal is the sigma-delta modulator circuit input signal.

12. The method of claim 10, further comprising:
combining an output signal of the sigma-delta modulator circuit with an input signal of the sigma-delta modulator circuit so as to provide the loopfilter input signal, wherein the feed-forward signal is the loopfilter input signal.

13. The method of claim 10, wherein the circuit node is within the loopfilter.

14. The circuit of claim 1, wherein the feed-forward signal is filtered but not amplified.

15. The circuit of claim 1, wherein the output summation node follows all of the integrator or resonator sections.

16. The circuit of claim 1, wherein the specific phase shift is implemented using a weighted vector summation of quadrature signals.

* * * * *